US008097521B2

(12) United States Patent
Van Lammeren

(10) Patent No.: US 8,097,521 B2
(45) Date of Patent: Jan. 17, 2012

(54) ELECTRONIC DEVICE COMPRISING AN INTEGRATED CIRCUIT AND A CAPACITANCE ELEMENT

(75) Inventor: Joop Van Lammeren, Nijmegen (NL)

(73) Assignee: NXP B.V., Eindhoven (NL)

( * ) Notice: Subject to any disclaimer, the term of this patent is extended or adjusted under 35 U.S.C. 154(b) by 38 days.

(21) Appl. No.: 12/815,954

(22) Filed: Jun. 15, 2010

(65) Prior Publication Data

US 2010/0251542 A1 Oct. 7, 2010

Related U.S. Application Data

(62) Division of application No. 11/632,887, filed as application No. PCT/IB2005/052261 on Jul. 7, 2005, now Pat. No. 7,750,436.

(30) Foreign Application Priority Data

Jul. 19, 2004 (EP) ..................................... 04103431

(51) Int. Cl.
*H01L 21/20* (2006.01)

(52) U.S. Cl. ... 438/381; 438/386; 438/393; 257/E21.008
(58) Field of Classification Search .................. 438/381, 438/386, 393; 257/E21.008
See application file for complete search history.

(56) References Cited

U.S. PATENT DOCUMENTS 7,495,334 B2 * 2/2009 Rapport et al. ............... 257/738

FOREIGN PATENT DOCUMENTS

EP 1 137 332 9/2001
WO 02/11206 2/2002

* cited by examiner

*Primary Examiner* — Ngan Ngo

(57) ABSTRACT

An electronic device (ICD) comprises an integrated circuit (AIC) and a capacitance element (PIC). The integrated circuit (AIC) is provided with a plurality of circuit contact pairs (CI). The capacitance element (PIC) is provided with a plurality of capacitance contact pairs (CC). A capacitance is present between each of at least part of the capacitance contact pairs (CC). The plurality of capacitance contact pairs (CC) faces the plurality of circuit contact pairs (CI). At least a part of the capacitance contact pairs (CC) is electrically coupled in a pair-by-pair manner to at least a part of the circuit contact pairs (CI).

14 Claims, 4 Drawing Sheets

ELECTRONIC DEVICE COMPRISING AN INTEGRATED CIRCUIT AND A CAPACITANCE ELEMENT

RELATED PATENT DOCUMENTS

This patent document is a divisional under 35 U.S.C. §120 of U.S. patent application Ser. No. 11/632,887 filed on May 15, 2008, which is a 35 U.S.C. §371 national stage entry of International Application No. PCT/IB2005/052261 filed on Jul. 7, 2005 which claims priority benefit under 35 U.S.C. §119 of European Patent Application No. 04103431.5 filed on Jul. 19, 2004, to which priority is also claimed here.

An aspect of the invention relates to an electronic device that comprises an integrated circuit and a capacitance element. The electronic device may constitute, for example, a signal processor having analog and digital signal processing circuits. Other aspects of the invention relate to a method of manufacturing such an electronic device, a signal processing apparatus comprising such an electronic device, an integrated circuit and a capacitance element as such.

An integrated circuit may require one or more so-called decoupling capacitances, for instance for power supply decoupling in digital integrated circuits. A decoupling capacitance prevents the occurrence of relatively strong parasitic signals that may cause a malfunctioning of the integrated circuit. The decoupling capacitance may have a form that, for example, is similar to that of the integrated circuit, which is typically planar. The article "High density, Low-Loss MOS capacitors for Integrated RF Decoupling" by F. Roozeboom et al. published in the International Journal Microcircuits and Electronic Packaging, 24 (3) (2001) pp. 182-196, describes a decoupling capacitance. The decoupling capacitance is formed by high density MOS capacitors fabricated in 6-inch macroporous silicon wafers.

Furthermore, U.S. Pat. No. 6,222,260 discloses the combination of an integrated circuit with digital circuitry and a decoupling capacitor in a configuration wherein the decoupling capacitor faces the integrated circuit.

According to an aspect of the invention, an electronic device comprises an integrated circuit and a capacitance element. The integrated circuit is provided with a plurality of circuit contact pairs. The capacitance element is provided with a plurality of capacitance contact pairs. A capacitance is present between each of at least a part of the capacitance contact pairs. The plurality of capacitance contact pairs faces the plurality of circuit contact pairs. At least a part of the capacitance contact pairs is electrically coupled in a pair-by-pair manner to at least a part of the circuit contact pairs.

The invention takes the following aspects into consideration. An integrated circuit typically comprises relatively many sub-circuits, such as, for example, logic gates, drivers, or amplifiers. Each sub-circuit occupies a different location within the integrated circuit. The high-frequency behavior of a sub-circuit depends on the electrical path that couples the sub-circuit to a decoupling capacitance. The lower the impedance of this electrical path, the better the high-frequency behavior of the sub-circuit will be. The electrical path has a relatively low impedance if the electrical path is relatively short or if the electrical path is relatively wide, or both. The electrical path will be relatively short for a sub-circuit that is relatively close to the decoupling capacitance. However, there may be one or more sub-circuits that are relatively far from the decoupling capacitance. The electrical path can be made relatively wide for those sub-circuits in order to have a sufficiently low impedance. However, a relatively wide electrical path requires an appreciable amount of surface area, which is not always available in the integrated circuit and which, furthermore, is relatively costly.

In accordance with the aspect of the invention described hereinbefore, the integrated circuit has various circuit contact pairs that face capacitance contact pairs between which a capacitance is present. The circuit contact pairs and the capacitance contact pairs are electrically coupled on a pair-by-pair basis. Accordingly, individual capacitances in the capacitive element are coupled individually to the integrated circuit in a small area. Consequently, there will be relatively many sub-circuits in the integrated circuit that are relatively close to a capacitance, which can be used for decoupling purposes. It is thus possible for electrical paths, which couple sub-circuits to decoupling capacitances, to have an average length that is relatively modest. This allows the integrated circuit to have a satisfactory high-frequency behavior. The coupling is preferably established using a solder connection, and particularly with a solder bump. As a solder material, use can be made of conventional solders on lead or tin basis, but also of metals such as gold, copper. Particularly good results have been obtained with bumps including an immersion soldering layer on the basis of a Sn or a In-alloy, and provided on an underbump metallization of copper, nickel or the like. Such bumps can be provided with a very high pitch, up to less than 10 microns. The fact that the distance between the capacitive element and the integrated circuit will be small is not a problem, since both of them have a semiconductor substrate with at least comparable coefficients of thermal expansion.

In a particular embodiment, the integrated circuit comprises analogue circuits, memories and logic circuits, and the capacitances are coupled to the logic circuit only. Preferably, the capacitive element covers the complete area of the logic circuit.

In a suitable embodiment, use is made of trench capacitors, as disclosed in the above mentioned article. The trench capacitors have a very small surface area. Moreover, it was found that a bond pad may be provided directly on top of a capacitor. Herewith a very dense array of bumps for connection to the integrated circuit can be provided. In order to provide a low-ohmic connection and coupling, the integrated circuit is provided with contact pads that, as seen in perpendicular projection, have a substantial overlap with the transistors. Such a layout is known per se as a 'bond pads on active'-layout. Although not needed explicitly for the adhesion of bumps, it is preferred herein that the bond pads are present on top of the passivation layer of the integrated circuit.

In a most suitable embodiment, the capacitance contact pairs are substantially evenly distributed over a surface area of the capacitive element. As a consequence, by a most efficient distribution and the use of trench capacitors, the resulting structure has a chessboard pattern of inputs and outputs. Generally, the input is a signal pad ($V_{ss}$), and the output is a ground pad ($V_{dd}$). As will be understood, the bumps between integrated circuit and capacitive element will have the same pattern. In this layout, the array of bumps has a coaxial structure, which is a type of transmission line and has a very low parasitic impedance.

It is preferred that only part of the decoupling capacitors are provided in a capacitive element separate from the integrated circuit. Suitably, 30-60% of the capacitances, and preferably about 50%, are present in the capacitive element.

The capacitive element can be provided in combination with the integrated circuit in various ways: as a separate element, or as part of a carrier or another device.

In a first embodiment, the capacitive element has a surface area that is smaller than that of the integrated circuit. It is then placed on top of the integrated circuit, before packaging of the electronic device in a conventional manner. In this embodiment, the shape of the logic circuit should be as rectangular as possible, and any other circuits, such as the analogue circuits and the memories if present, should be designed in another area. These circuits would reduce the effective fill factor of the logic circuit, thereby necessitating a larger, more expensive capacitive element. The separation of the different types of circuits requires an amendment of the design of a conventional digital integrated circuit.

In an alternative embodiment, the capacitive element forms part of an interposer, and may be the carrier for the integrated circuit. It is then suitable that this carrier extends laterally beyond the integrated circuits and comprises further functions such as resistors, interconnects. In this case, the capacitances and the individual connections are, by preference, still limited to the area of the logic circuit.

In a further embodiment, not only the capacitive elements are present in a separate chip, but also the memory. In view of the decrease in cost of the memory and in view of the use of stacked-die configurations, there is a trend to separate the memory circuit from the logic circuit, and to put it into a separate device, that is afterwards assembled with the logic circuit. As trench capacitors are suitable for use in memories as well, the memory can be integrated with the decoupling capacitors into one device.

Another advantage of the invention relates to the following aspects. It is possible to separately manufacture the integrated circuit and the capacitance element of the electronic device in accordance with the invention, before they are assembled. Accordingly, the integrated circuit can be manufactured using a technology that is cost-efficient for integrated circuits. The capacitance element can be manufactured using a different technology that is cost-efficient for capacitance elements. For example, the integrated circuit can be manufactured using a standard technology, whereas the capacitance element can be manufactured in accordance with the technology described in the article cited hereinbefore. This approach is more cost-efficient compared with an approach in which a relatively complicated technology is used to manufacture integrated circuits that comprise decoupling capacitances. For those reasons, the invention allows cost efficiency.

These and other aspects of the invention will be described in greater detail hereinafter with reference to drawings.

Figure 1:
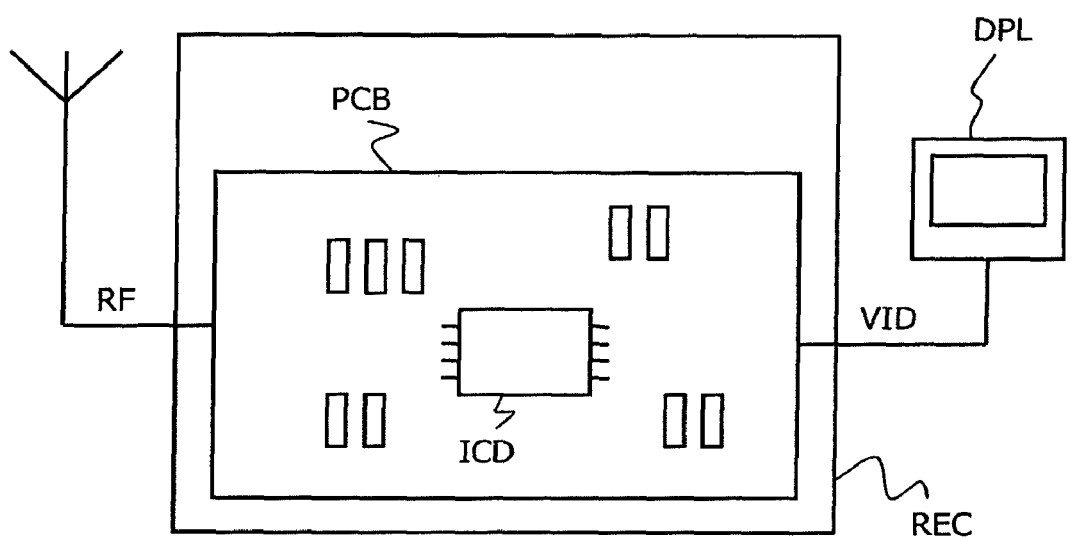
FIG. 1 is a block diagram that illustrates a television set.

FIG. 1 illustrates a television set TV. The television set TV comprises a receiver REC and a display device DPL. The receiver REC comprises a printed circuit board PCB on which an integrated circuit device ICD and other components are mounted. The integrated circuit device ICD forms part of a signal processing chain that derives a video signal VID from a radiofrequency input signal RF. The display device DPL displays the video signal VID.

Figure 2:
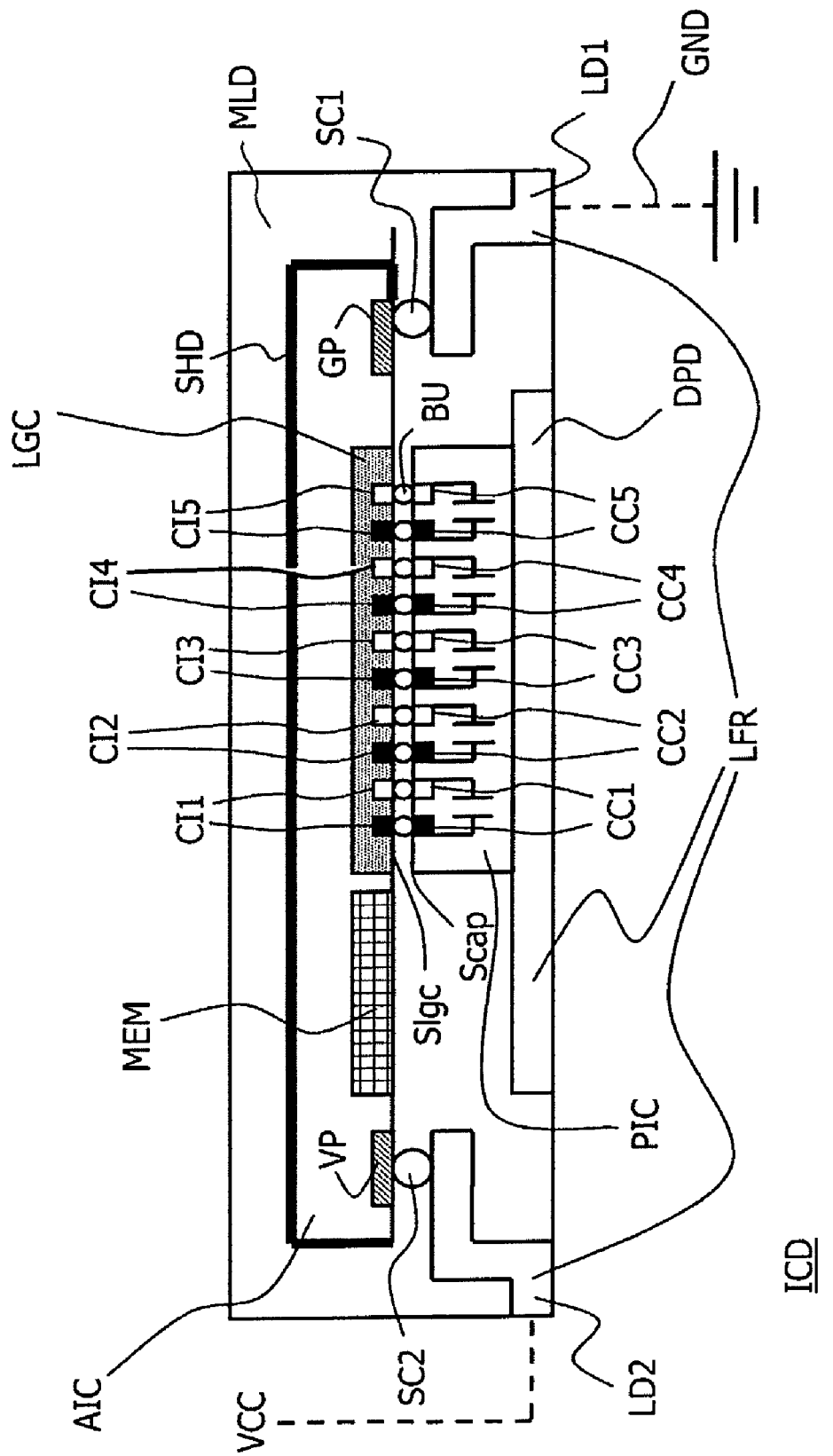
FIG. 2 is a cross-section diagram that illustrates an integrated circuit device of the television set.

FIG. 2 illustrates the integrated circuit device ICD. FIG. 2 is a diagrammatic cross section of the integrated circuit device ICD. The integrated circuit device ICD comprises an active integrated circuit AIC and a passive integrated circuit PIC, which are mounted on a lead frame LFR. A mold compound MLD covers the active integrated circuit AIC and the passive integrated circuit PIC so as to provide a mechanical protection. The lead frame LFR comprises a die pad DPD on which the passive integrated circuit PIC is mounted. The lead frame LFR further comprises various electrical leads LD for electrically coupling the integrated circuit device ICD to other components. A signal ground lead LD1 and a supply voltage lead LD2 couple the integrated circuit device ICD to a signal ground GND and a supply voltage VCC, respectively.

The active integrated circuit AIC comprises a logic circuit LGC, a memory circuit MEM, a supply voltage pad VP, a signal ground pad GP, and a conductive shield SHD that is coupled to the signal ground pad GP. A solder connection SC1 electrically couples the signal ground pad GP to the signal ground lead LD1 of the lead frame LFR. Another solder connection SC2 electrically couples the supply voltage pad VP to the supply voltage lead LD2 of the lead frame LFR. Accordingly, the logic circuit LGC and the memory circuit MEM may receive the supply voltage VCC from an external source via, for example, supply voltage lines that are present on the printed circuit board PCB illustrated in FIG. 1. The logic circuit LGC may be arranged to process, for example, digital television signals. To that end, the logic circuit LGC may cooperate with the memory circuit MEM. For example, samples of a digital television signal may temporarily be stored in the memory circuit MEM.

The active integrated circuit AIC comprises a plurality of circuit contact pairs CI1, . . . , CI5, which occupy a surface area Slgc of the active integrated circuit AIC. When the active integrated circuit AIC is viewed in the direction of the surface area Slgc, the logic circuit LGC lies underneath the surface area Slgc and thus underneath the circuit contact pairs CI. The circuit contact pairs CI are electrically coupled to the logic circuit LGC. For example, each circuit contact pair CI may be coupled to a different sub-circuit that forms part of the logic circuit LGC. Preferably, the circuit contact pair CI is physically close to the sub-circuit to which it is coupled. The circuit contact pairs CI that are illustrated have a circuit contact that is represented by a black square, the other circuit contact being represented by a white square. The black square of a circuit contact pair CI may be coupled, for example, to a signal ground path of a sub-circuit. The white square of a circuit contact pair CI may be coupled to a supply voltage path of the same sub-circuit.

The passive integrated circuit PIC comprises a plurality of capacitance contact pairs CC1, . . . , CC5, which occupy a surface area Scap of the passive integrated circuit PIC. The capacitance contact pairs CC face the circuit contact pairs CI. Bump connections BU electrically couple the capacitance contact pairs CC to the circuit contact pairs CI in a pair-by-pair manner. A capacitance is present between each of the capacitance contact pairs CC. The capacitance that is present between a capacitance contact pair CC will also be present between the circuit contact pair CI to which the capacitance contact pair is electrically coupled. The capacitance may thus form a decoupling capacitance for the sub-circuit to which the circuit contact pair CI is coupled. For example, the capacitance may constitute a decoupling capacitance between a supply voltage path and a signal ground path of the sub-circuit concerned. Accordingly, a sub-circuit can have its own decoupling capacitance and, moreover, the decoupling capacitance can be relatively close.

Figure 3:
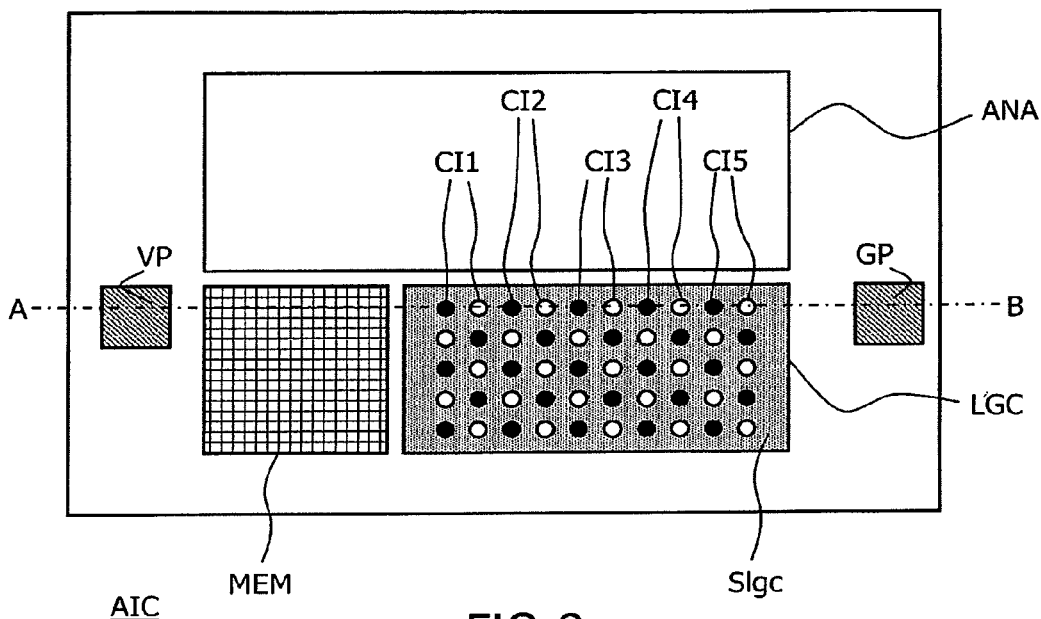
FIG. 3 is a top view diagram that illustrates an active integrated circuit of the integrated circuit device.

FIG. 3 illustrates the active integrated circuit AIC. FIG. 3 is a top side view of the active integrated circuit AIC. A cross-sectional line A-B in FIG. 3 indicates the position of the cross-sectional view illustrated in FIG. 2. FIG. 3 shows the supply voltage pad VP, the signal ground pad GP, the memory circuit MEM, and the logic circuit LGC that form part of the active integrated circuit AIC. FIG. 3 further illustrates that the active integrated circuit AIC comprises an analog circuit ANA. The analog circuit ANA may include, for example, an analog-to-digital converter so as to convert an analog video signal into a digital video signal. Each circuit within the active integrated circuit AIC occupies a different area.

FIG. 3 illustrates that the active integrated circuit AIC comprises further circuit contact pairs CI in addition to those illustrated in FIG. 2. Circuit contact pairs CI are present on substantially the whole area that the logic circuit LGC occupies. That is, the surface area Slgc that the circuit contact pairs CI occupy, coincides with the area that the logic circuit LGC occupies within the active integrated circuit AIC. FIG. 3 further illustrates that the surface area Slgc that the circuit contact pairs CI occupy has a substantially rectangular shape. Accordingly, the surface area Scap of the passive integrated circuit PIC that the capacitance contact pairs CC occupy, which is illustrated in FIG. 2, may also have a substantially rectangular shape and may have the same size. The size of the passive integrated circuit PIC in terms of length and width may thus substantially correspond to the surface area Slgc that the circuit contact pairs CI occupy. This is cost-efficient.

Figure 4:
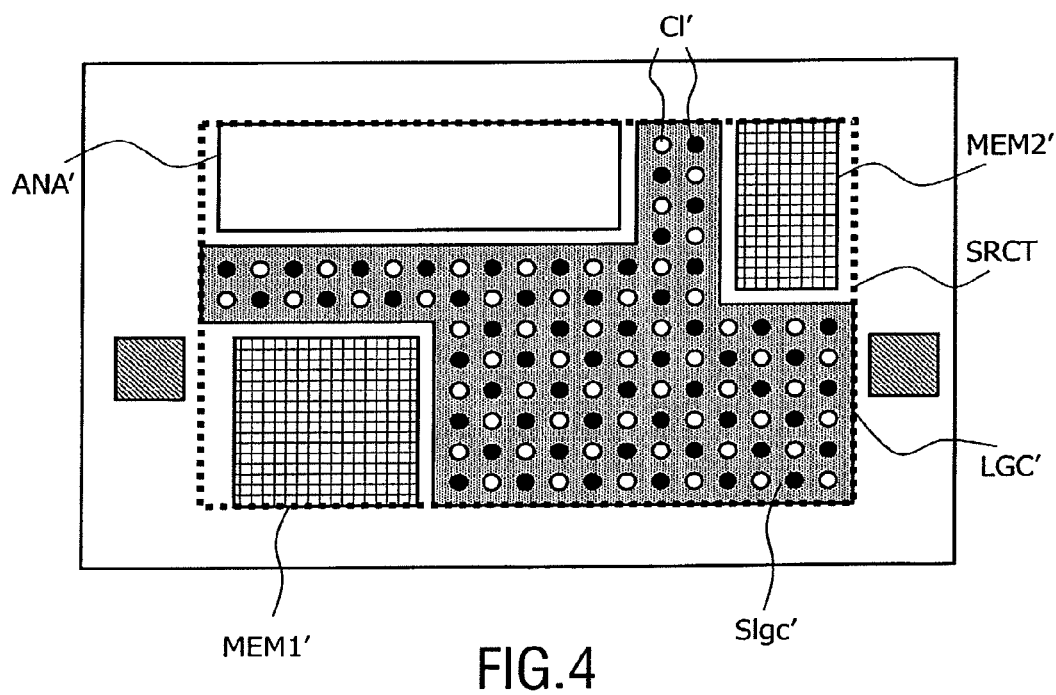
FIG. 4 is a top view diagram that illustrates an alternative active integrated circuit.

FIG. 4 illustrates an alternative active integrated circuit AIC' that requires a relatively large passive integrated circuit, which is less cost efficient. The alternative active integrated circuit AIC' comprises an alternative logic circuit LGC', two alternative memory circuits MEM1', MEM2', an alternative analog circuit ANA', and a plurality of circuit contact pairs CI' that occupy a surface area Slgc'. The surface area Slgc' that circuit contact pairs CI occupy substantially coincides with the area that the alternative logic circuit LGC' occupies.

FIG. 4 illustrates the smallest possible rectangle SRCT that can cover a surface area Slgc' which the circuit contact pairs CI' occupy. A rectangular passive integrated circuit would at least need to have the size of the smallest possible rectangle SRCT in terms of length and width. Let it be assumed that this rectangular passive integrated circuit PIC has a main face that is substantially filled with capacitance contact pairs. Only a relatively modest percentage can be electrically coupled with the circuit contact pairs CI'. In effect, surface areas of the rectangular passive integrated circuit that face the two alternative memory circuits MEM1', MEM2', and the alternative analog circuit ANA', would effectively not be used. It is therefore advantageous that the surface area Slgc, which the circuit contact pairs CI occupy, has a substantially rectangular shape as illustrated in FIG. 3. It is further advantageous that the circuit that needs to be coupled also has a substantially rectangular shape and occupies substantially the same area as the circuit contact pairs. This allows capacitances of the passive integrated circuit to be coupled to sub-circuits in the active integrated circuit via relatively short electrical paths, which contributes to a satisfactory high-frequency behavior.

Figure 5:
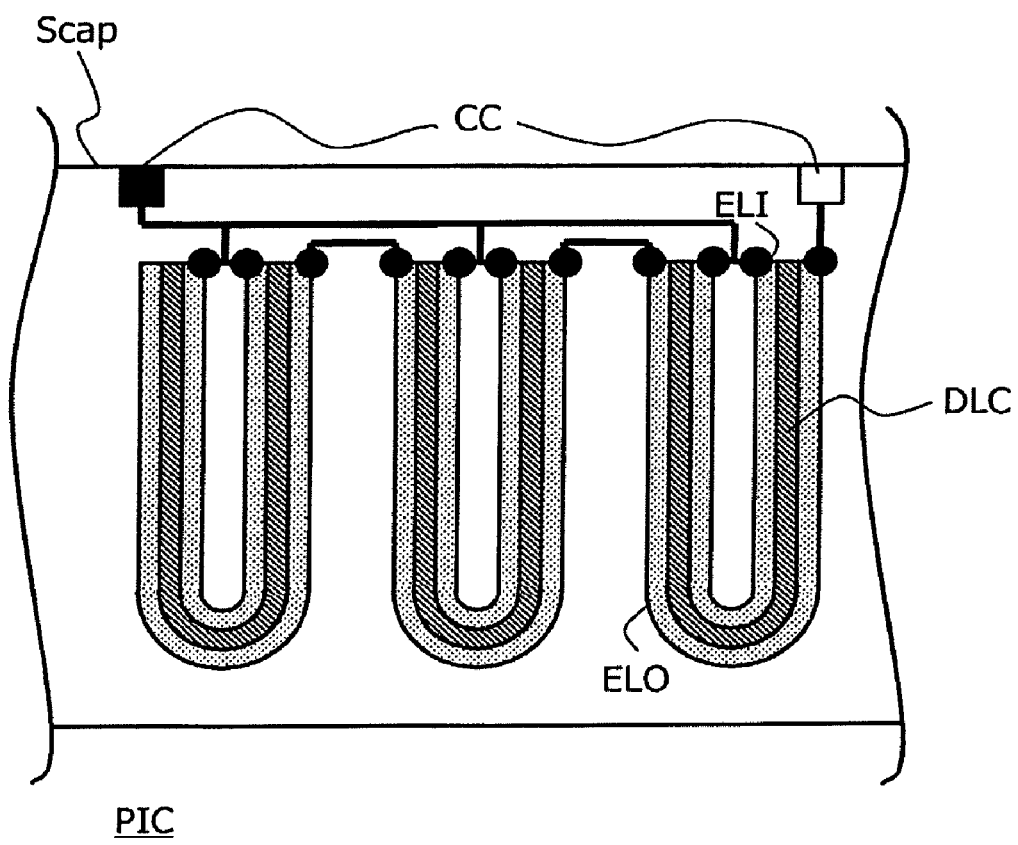
FIG. 5 is a cross-section diagram that illustrates a passive integrated circuit of the integrated circuit device.

FIG. 5 illustrates the passive integrated circuit PIC. FIG. 5 is a diagrammatic cross section of a part of the passive integrated circuit PIC. FIG. 5 shows a capacitance contact pair CC on the surface area Scap, which surface area is also illustrated in FIG. 2. The passive integrated circuit PIC comprises a pair of electrodes ELI, ELO between which a dielectric material DLC is present. An inner electrode ELI is electrically coupled to the capacitance contact represented by a black square. An outer electrode ELO is electrically coupled to the capacitance contact represented by a white square. The pair of electrodes ELI, ELO is substantially perpendicular to the surface area Scap that the capacitance contact pairs CC occupy. Accordingly, it is possible to obtain a relatively high capacitance per unit of surface area. A relatively small surface area is sufficient to obtain a relatively large capacitance, which is typically required for decoupling purposes. The passive integrated circuit PIC illustrated in FIG. 5 may be manufactured, for example, using a technology as described in the article cited hereinbefore.

The integrated circuit device ICD illustrated in FIG. 2 can be manufactured in various different manners. For example, the active integrated circuit AIC may be manufactured in accordance with a conventional technology, whereas the passive integrated circuit PIC may be manufactured separately in accordance with a special technology, such as, for example, a technology as described in the article cited hereinbefore. The passive integrated circuit PIC may be fixed to the die pad DPD of the lead frame LFR. Subsequently, the active integrated circuit AIC is positioned so that the circuit contact pairs CI face the capacitance contact pairs CC of the passive integrated circuit PIC. Subsequently, the active integrated circuit AIC is fixed to the passive integrated circuit PIC and the lead frame LFR. This can be achieved, for example, by means of heating solder balls, which are present on the circuit contact pairs CI, the signal ground pad GP, and the supply voltage pad VP. The solder balls that are present on the circuit contact pairs CI will reflow and form the bump connections BU illustrated in FIG. 2.

In accordance with an alternative method, the passive integrated circuit PIC is first fixed to the active integrated circuit AIC so as to obtain an integrated circuit assembly in which the capacitance contact pairs CC face the circuit contact pairs CI. The capacitance contact pairs CC and the circuit contact pairs CI are electrically coupled to each other on a pair-by-pair basis. The integrated circuit assembly is subsequently mounted on the lead frame LFR.

The detailed description hereinbefore with reference to the drawings illustrates the following characteristics. An electronic device (ICD) comprises an integrated circuit (active integrated circuit AIC) and a capacitance element (passive integrated PIC). The integrated circuit (AIC) is provided with a plurality of circuit contact pairs (CI). The capacitance element (PIC) is provided with a plurality of capacitance contact pairs (CC). A capacitance is present between each of at least a part of the capacitance contact pairs (CC). The plurality of capacitance contact pairs (CC) faces the plurality of circuit contact pairs (CI). At least a part of the capacitance contact pairs (CC) is electrically coupled in a pair-by-pair manner to at least a part of the circuit contact pairs (CI). This allows the integrated circuit to have a satisfactory high-frequency behavior.

The detailed description hereinbefore further illustrates the following optional characteristics. The capacitance contact pairs (CC) are substantially evenly distributed over a surface area (Scap) of the capacitance element (PIC). This further contributes to a satisfactory high-frequency behavior.

The detailed description hereinbefore further illustrates the following optional characteristics. The circuit contact pairs (CI) occupy a surface area (Slgc) of the integrated circuit (AIC). This surface area (Slgc) has a shape that is substantially rectangular. This allows cost efficiency.

The detailed description hereinbefore illustrates the following optional characteristics. The capacitance element (PIC) comprises a pair of electrodes (ELI, ELO) that constitute a capacitance between a capacitance contact pair (CC). The pair of electrodes (ELI, ELO) is substantially perpendicular to a surface area (Scap) that the capacitance contact pairs (CC) occupy. This allows the capacitance element to have a relatively large capacitance per unit of surface, which further contributes to a satisfactory high-frequency behavior.

The aforementioned characteristics can be implemented in numerous different manners. In order to illustrate this, some alternatives are briefly indicated. It is not absolutely necessary that each of the circuit contact pairs is coupled to each of the capacitance contact pairs. For example, referring to FIG. 2, let it be assumed that circuit contact pair CI5 were not electrically coupled to capacitance contact pair CC5. The integrated circuit device ICD may still have a satisfactory high-frequency behavior. Referring to FIG. 2, although the conductive shield SHD will generally contribute to a satisfactory high-frequency behavior, the conductive shield SHD may be omitted in order to reduce cost. Referring to FIG. 2, although the active integrated circuit ACI is mounted on the lead frame LFR in accordance with a flip-chip technology, which contributes to a satisfactory high-frequency behavior, a different mounting technology may be used, such as, for example, wire bonding. It should further be noted that the electronic device in accordance with the invention may be applied in any type of signal processing apparatus. The television set illustrated in FIG. 1 is merely an example. The electronic device may be applied in, for example, a computer or a digital signal processor for processing high-speed data.

There are numerous ways of implementing functions by means of items of hardware or software, or both. In this respect, the drawings are very diagrammatic, each representing only one possible embodiment of the invention. Thus, although a drawing shows different functions as different blocks, this by no means excludes that a single item of hardware or software carries out several functions. Nor does it exclude that an assembly of items of hardware or software or both carry out a function.

The remarks made hereinbefore demonstrate that the detailed description with reference to the drawings, illustrates rather than limits the invention. There are numerous alternatives, which fall within the scope of the appended claims. Any reference sign in a claim should not be construed as limiting the claim. The word "comprising" does not exclude the presence of elements or steps other than those listed in a claim. The word "a" or "an" preceding an element or step does not exclude the presence of a plurality of such elements or steps.

The invention claimed is:

1. A method of manufacturing an electronic device on the basis of:
   an integrated circuit with a plurality of circuit contact pairs and
   a capacitance element provided with a plurality of capacitance contact pairs, a capacitance being present between each of at least a part of the capacitance contact pairs, the method comprising:
   a positioning step in which the plurality of capacitance contact pairs is made to face the plurality of circuit contact pairs and
   a coupling step in which at least a part of the capacitance contact pairs are electrically coupled in a pair-by-pair manner to at least a part of the circuit contact pairs.

2. The method of claim 1, wherein the capacitance contact pairs are implemented to be substantially evenly distributed over a surface area of the capacitance element die.

3. The method of claim 1, wherein the integrated circuit includes a logic circuit separate from an analogue circuit, and the circuit contact pairs are connected to the logic circuit only.

4. The method of claim 1, wherein the circuit contact pairs occupy a surface area of the integrated circuit, the surface area having a shape that is substantially rectangular.

5. The method of claim 1, wherein the capacitance element comprises a pair of electrodes that constitute a capacitance between a capacitance contact pair, the pair of electrodes being substantially perpendicular to a surface area that the capacitance contact pairs occupy.

6. The method of claim 1, wherein the capacitive element is part of a device that further comprises a memory circuit which cooperates with a logic circuit in the integrated circuit.

7. The method of claim 1, wherein the capacitive element is part of an interposer device that acts as a carrier for the integrated circuits and is provided with contact pads for coupling to an external board.

8. The method of claim 1, further including the step of manufacturing the electronic device with a substrate that couples the electronic device to other components of the signal processing apparatus.

9. The method of claim 1, wherein the capacitance element provides
   a capacitance between each of at least a part of the capacitance contact pair, the contact pairs being arranged for electrical coupling in a pair-by-pair manner to circuit contact pairs of an integrated circuit.

10. The method of claim 1, further including the integrated circuit as an active circuit.

11. The method of claim 10, further including fixing the capacitance element to the integrated circuit.

12. The method of claim 10, further including the integrated circuit as an active circuit to provide an assembly in which the capacitance contact pairs face the circuit contact pairs.

13. The method of claim 12, further including the integrated circuit as an active circuit to provide an assembly in which the capacitance contact pairs face the circuit contact pairs, and in which the respectively facing pairs are coupled on a pair-by-pair basis.

14. The method of claim 10, further including mounting the assembly on a lead frame.

* * * * *